(12) United States Patent
Chung et al.

(10) Patent No.: US 7,800,963 B2
(45) Date of Patent: Sep. 21, 2010

(54) SEMICONDUCTOR MEMORY DEVICE OPERATING WITH PREFETCH SCHEME

(75) Inventors: Jin-Il Chung, Kyoungki-Do (KR); Kyung-Whan Kim, Kyoungki-Do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 128 days.

(21) Appl. No.: 12/165,054

(22) Filed: Jun. 30, 2008

(65) Prior Publication Data

US 2009/0168566 A1  Jul. 2, 2009

(30) Foreign Application Priority Data

Dec. 27, 2007 (KR) ................... 10-2007-0139200

(51) Int. Cl.
*G11C 7/00* (2006.01)
(52) U.S. Cl. ............... 365/193; 365/233.5; 365/189.07; 365/194
(58) Field of Classification Search ............... 365/193, 365/233.5, 189.07, 194, 189.09
See application file for complete search history.

(56) References Cited

U.S. PATENT DOCUMENTS

| | | | | |
|---|---|---|---|---|
| 5,438,550 A | * | 8/1995 | Kim | 365/233.5 |
| 5,485,111 A | * | 1/1996 | Tanimoto | 327/143 |
| 7,091,758 B2 | * | 8/2006 | Chun et al. | 327/143 |
| 7,502,239 B2 | * | 3/2009 | Itoh | 363/60 |
| 7,545,207 B2 | * | 6/2009 | Chang et al. | 330/10 |

FOREIGN PATENT DOCUMENTS

| | | |
|---|---|---|
| JP | 08-096573 | 4/1996 |
| KR | 1020050095688 A | 9/2005 |

OTHER PUBLICATIONS

Notice of Allowance issued from Korean Intellectual Property Office on Jun. 22, 2009 with an English Translation.
Notice of Preliminary Rejection issued from Korean Intellectual property Office on Dec. 23, 2008 with an English translation.

* cited by examiner

*Primary Examiner*—Connie C Yoha
(74) *Attorney, Agent, or Firm*—IP & T Law Firm PLC

(57) ABSTRACT

A semiconductor memory device adjusts an activation timing and pulse width of a pin strobe signal according to a power supply voltage variation, and thereby loads data on a pipelatch properly and prevents an activation period of a pin strobe signal from falling out of a period for valid data. The semiconductor memory device includes a voltage detector configured to detect a level of a power supply voltage to output a detection signal, a pin strobe signal transfer path configured to transfer a pin strobe signal determining an input timing of data to a pipelatch, a delay controller configured to control a delay value of the pin strobe signal transfer path in response to the detection signal, and a pulse width modulator configured to modulate a pulse width of the pin strobe signal in response to the detection signal.

18 Claims, 5 Drawing Sheets

SEMICONDUCTOR MEMORY DEVICE OPERATING WITH PREFETCH SCHEME

CROSS-REFERENCE TO RELATED APPLICATION

The present invention claims priority of Korean patent application number 10-2007-0139200, filed on Dec. 27, 2007, which is incorporated by reference in its entirety.

BACKGROUND OF THE INVENTION

The present invention relates to a semiconductor memory device, and more particularly to a semiconductor memory device having an improved margin of a pulse width and enabling timing of a pin strobe signal that determines a timing of loading data on a pipelatch.

As a synchronous dynamic random access memory (SDRAM) has been continuously developed from single data rate (SDR) to double data rate (DDR), DDR2, DDR3, etc, a prefetch scheme is used in DDR/DDR2/DDR3 SDRAMs.

The prefetch scheme is used to overcome a limitation caused by a difficulty in increasing an operating speed of a core region of a semiconductor memory device. In the prefetch scheme or architecture, data is processed in parallel at the core region where it is difficult to increase an operating speed, and the data is rapidly input/output in series at an input/output (I/O) region.

For example, a DDR2 SDRAM employs a 4-bit prefetch scheme in which 4-bit data are read from memory cells in parallel according to a read command, and the read 4-bit data are output in series through the identical data pin (DQ pin) during two clock cycles.

As is well known, an apparatus that sequentially outputs data in series through the data pin is necessarily required to use the prefetch scheme. Such an apparatus is called a pipelatch. To determine a timing of loading the data on the pipelatch, a pin strobe signal or a pipelatch input signal is needed, which generally is represented as a symbol of PIN.

Data to be output during a read operation, and a pin strobe signal for determining the timing of loading the data on the pipelatch are transferred to the pipelatch from a bank. The data is transferred through a global input/output (GIO) line and experiences an RC delay. In this case, delay values of the data are not greatly changed in spite of process-voltage-temperature (PVT) variations because the RC delay has little effect on the PVT variation. However, the pin strobe signal is transferred to the pipelatch while passing through a variety of logic devices, and thus delay values of the pin strobe signal are greatly changed according to the PVT variations.

FIG. 1 is a block diagram illustrating a preliminary pin strobe signal generating unit of a conventional semiconductor memory device. The preliminary pin strobe signal generating unit may be provided around a bank of the semiconductor memory device.

The preliminary pin strobe signal generating unit includes a delay line 101, a NAND gate 103 and inverters 102 and 104. A preliminary pin strobe signal PRE_PIN is generated through a combination of a column address strobe (CAS) pulse signal CAS_PULSE and a write I/O sense amplifier signal WT_IOSA. The CAS pulse signal CAS_PULSE is an internal pulse signal generated by a column command, e.g., write/read command. The write I/O sense amplifier signal WT_IOSA has a logic high level in a write operation and a logic low level in a read operation.

When the write I/O sense amplifier signal WT_IOSA of a logic low level is input in a read operation and the CAS pulse signal CAS_PULSE of a logic high level is input, the NAND gate 103 receives two high-level signals to output a pulse signal that is activated to a logic low level. This pulse signal is inverted through the inverter 104 so that the preliminary pin strobe signal PRE_PIN, which is activated to a logic high level, is output. In short, the preliminary pin strobe signal PRE_PIN is activated around a band during the read operation.

An I/O sense amplifier strobe signal IOSTBP is a column-based sense amplifier strobe signal for reading data of a bank during the read operation, and determines a timing of loading data on global input/output (GIO) lines from the bank. The I/O sense amplifier strobe signal IOSTBP is obtained by modulating a pulse width and delay time of the preliminary pin strobe signal PRE_PIN, which is shown in the lower part of FIG. 1. The preliminary pin strobe signal PRE_PIN is fed to a pulse modulation circuit 109 via a delay line 105. The pulse width of the I/O sense amplifier strobe signal IOSTBP is determined according to a delay value of a delay line 106 in the pulse modulation circuit 109, which combines the signal delayed by the delay line 106 with a signal that bypasses the delay line 106 in NAND gate 17.

FIG. 2 is a block diagram illustrating a pin strobe signal generating unit. The pin strobe signal generating unit generates a pin strobe signals PIN using the preliminary pin strobe signal PRE_PIN of FIG. 1.

The pin strobe signal generating unit includes an inverter 201, a delay line 202, NAND gates 203 and 204, and a pulse width modulation circuit 205. The preliminary pin strobe signal PRE_PIN is delayed by the delay line 202 and has a pulse width modulated by the pulse width modulation circuit 205 so that the pin strobe signal PIN is output.

Two NAND gates 203 and 204, which are cross-coupled to form a latch, are used to prevent the pin strobe signal PIN from being generated while a reset signal RSTB is activated to a logic low level. Since the reset signal RESTB is deactivated to a logic high level while a memory device is operating, the NAND gate 203 acts as an inverter simply during the operation of the memory device.

In the pulse width modulation circuit 205, a NAND gate 208 performs a NAND operation on an output signal of the NAND gate 203 and a signal obtained by delaying and inverting the output signal of the NAND gate 203 through a delay line 206 and an inverter 207, and thereafter an inverter 209 inverts an output signal of the NAND gate 208, thereby outputting the pin strobe signal PIN with the pulse width modulated. The pin strobe signal PIN has a pulse width corresponding to a delay value of the delay line 206.

Although the pin strobe signal generating unit of FIG. 2 may be positioned anywhere on a transfer path of the preliminary pin strobe signal PRE_PIN from a bank to a pipelatch, it is positioned around the pipelatch in general.

FIG. 3 is a timing diagram illustrating an operation of the pin strobe signal generating unit of FIG. 2.

Referring to FIG. 3, a PRE_PINBD signal, which is generated by inverting and delaying the preliminary pin strobe signal PRE_PIN through the inverter 201 and the delay line 202, is activated to a logic low level. The PRE_PINBD signal is inverted by the NAND gate 203 and its pulse width is modulated by the pulse width modulation circuit 205, so that the pin strobe signal PIN is output finally. The pin strobe signal PIN has the same pulse width as the delay value of the delay line 206 in the pulse width modulation circuit 205.

FIGS. 4A to 4D are timing diagrams of the pin strobe signal and data transferred through GIO lines during a read operation.

In FIGS. 4A to 4D, a reference symbol 'GIO' denotes a timing of data transferred to a pipelatch disposed around a data pin (DQ pin) from a bank through the GIO line, and a reference symbol 'PIN' denotes a timing of the pin strobe signal PIN transferred to the pipelatch through logic devices or the like. While the pin strobe signal PIN is activated, the pipelatch is enabled so that valid data of the GIO line is loaded on the pipelatch. To properly load the valid data on the pipelatch, therefore, the pin strobe signal PIN with a sufficient pulse width should be activated within a period for the valid data.

FIG. 4A is a timing diagram illustrating the valid data and the pin strobe signal PIN in the front of the pipelatch (i.e., around the DQ pin) under FAST PVT condition. The FAST PVT condition is a fast operating condition in which a process (P) is performed for a circuit to have fast characteristics, a voltage (V) is high, and a temperature (T) is low. Since the operating speed of a circuit is fast under the FAST PVT condition, a delay time caused by a logic device of the circuit may be relatively small. At this time, a pulse width also decreases, that is, the delay value of the delay line 206 decreases. If the pulse width, i.e., a width of an activation period of the pin strobe signal PIN, becomes too narrow, the valid data may not be loaded on the pipelatch properly.

FIG. 4B is a timing diagram illustrating the valid data and the pin strobe signal PIN under SLOW PVT condition. The SLOW PVT condition is a slow operating condition in which a process (P) is performed for a circuit to have slow characteristics, a voltage (V) is low, and a temperature (T) is high. In FIG. 4B, a reference symbol 'TGIO' indicates a delay time of the GIO line (data) in the SLOW PVT condition compared to the FAST PVT condition, and a reference symbol 'TLD' indicates a delay time of the pin strobe signal PIN in the SLOW PVT condition compared to the FAST PVT condition. When comparing the two delay times TGIO and TLD, it can be appreciated that the delay time TGIO is relatively smaller than the delay time TLD. This is because the delay time TLD is resulted from a variation of a logic delay with a PVT variation but the delay time TGIO is resulted from a variation of an RC delay with the PVT variation.

FIG. 4C is a timing diagram illustrating the valid data and the pin strobe signal PIN having an increased pulse width under FAST PVT condition so as to overcome problems caused by the narrow pulse width of the pin strobe signal PIN in FIG. 4A. That is, the delay line 206 of FIG. 2 is designed to have a greater delay value in FIG. 4C than that of FIG. 4A. Therefore, the activation timing of the pin strobe signal PIN in FIG. 4C is the same as that of the pin strobe signal PIN in FIG. 4A but its activation period, i.e., pulse width, becomes larger. Accordingly, data can be stably loaded on the pipelatch under the condition of FIG. 4C.

FIG. 4D is a timing diagram illustrating the valid data and the pin strobe signal PIN having an increased pulse width under SLOW PVT condition. Under this condition, a delay time is increased so that an activation timing of the pin strobe signal PIN is delayed and a pulse width of the pin strobe signal PIN also increases. Hence, it can be observed that the activation period of the pin strobe signal PIN falls out of the period for the valid data. If the activation period of the pin strobe signal PIN falls out of the period for the valid data, invalid data subsequent to the valid data or no data may be loaded on the pipelatch.

In summary, if the pin strobe signal PIN is set to have a narrow pulse width, the valid data may not be loaded on the pipelatch properly under the FAST PVT condition of FIG. 4A. On the other hand, if the pin strobe signal PIN is set to have a large pulse width, the activation period of the pin strobe signal PIN falls out of the period for the valid data under the SLOW PVT condition of FIG. 4D so that invalid data subsequent to the valid data may be loaded on the pipelatch.

The period for the valid data may be increased. However, the increase of the period for the valid data is limited by TCCD in the GIO lines. The TCCD is a parameter indicating how fast column commands such as read and write commands are sequentially input. The DDR2 standard specifies TCCD=2*tCK, and the DDR3 standard specifies TCCD=4*tCK.

Therefore, one clock cycle (tCK) should be increased to broaden the period for the valid data. To increase the one clock cycle (tCK), however, the operating speed should be lowered.

SUMMARY OF THE INVENTION

Embodiments of the present invention are directed to providing a semiconductor memory device which adjusts an activation timing and pulse width of a pin strobe signal according to a power supply voltage variation. The semiconductor memory device is capable of loading data on a pipelatch properly and preventing an activation period of a pin strobe signal from falling out of a period for valid data.

In accordance with an aspect of the present invention, there is provided a semiconductor memory device, which includes a voltage detector configured to detect a level of a power supply voltage to output a detection signal, a pin strobe signal transfer path configured to transfer a pin strobe signal determining an input timing of data to a pipelatch, and a delay controller configured to control a delay value of the pin strobe signal transfer path in response to the detection signal.

In accordance with an aspect of the invention, a semiconductor memory device includes a voltage detector configured to detect a level of a power supply voltage to output a detection signal, a pin strobe signal transfer path configured to transfer a pin strobe signal determining an input timing of data to a pipelatch, and a pulse width modulator configured to modulate a pulse width of the pin strobe signal in response to the detection signal on the pin strobe signal transfer path.

In accordance with another aspect of the invention, a semiconductor memory device includes a voltage detector configured to detect a level of a power supply voltage to output a detection signal, a pin strobe signal transfer path configured to transfer a pin strobe signal determining an input timing of data to a pipelatch, a delay controller configured to control a delay value of the pin strobe signal transfer path in response to the detection signal, and a pulse width modulator configured to modulate a pulse width of the pin strobe signal in response to the detection signal.

DESCRIPTION OF SPECIFIC EMBODIMENTS

Hereinafter, a semiconductor memory device in accordance with the present invention will be described in detail with reference to the accompanying drawings.

Figure 5:
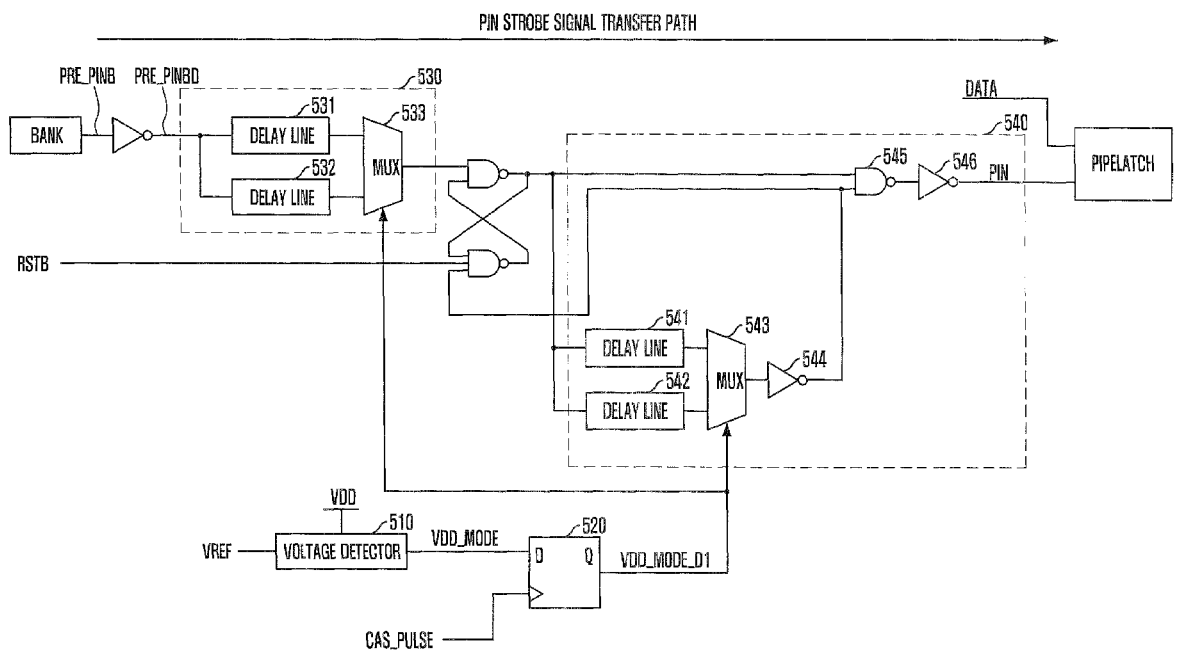
FIG. 5 is a block diagram of a semiconductor memory device in accordance with an embodiment of the present invention.

FIG. 5 is a block diagram of a semiconductor memory device in accordance with an embodiment of the invention.

Referring to FIG. 5, the semiconductor memory device includes a voltage detector 510, a delay controller 530, and a pulse modulator 540.

The voltage detector 510 detects the level of a power supply voltage VDD (hereinafter, referred to as VDD level) to output a detection signal VDD_MODE. The detection signal VDD_MODE is activated when the VDD level is greater than a predetermined voltage level. The detection signal VDD_MODE is input to the delay controller 530 and the pulse modulator 540 to indicate whether the current VDD level is high or low.

Although the voltage detector 510 is configured to generate one detection signal VDD_MODE in this embodiment, it may be differently designed to generate a plurality of detection signals. For example, an A detection signal VDD_MODEA may be set such that it is activated when the power supply voltage VDD is 1.2 V or more, and a B detection signal VDD_MODEB may be set such that it is activated when the power supply voltage VDD is 1.6 V or more. In this case, the VDD level can be more finely detected in comparison with the case of using the detection signal VDD_MODE only.

The semiconductor memory device of the invention may further include a level maintainer 520 connected to an output terminal of the voltage detector 510. The level maintainer 520 maintains the detection signal VDD_MODE at a constant level during a read operation, thereby preventing a pulse width and activation timing of the pin strobe signal PIN from being suddenly changed during the read operation. The level maintainer 520 is used to increase the stability of a circuit, and thus may be omitted if necessary. The level maintainer 520 may be configured as a D flip-flop that latches the detection signal VDD_MODE to output a latched detection signal VDD_MODE_D1 in synchronization with a CAS pulse signal CAS_PULSE.

Figure 1:
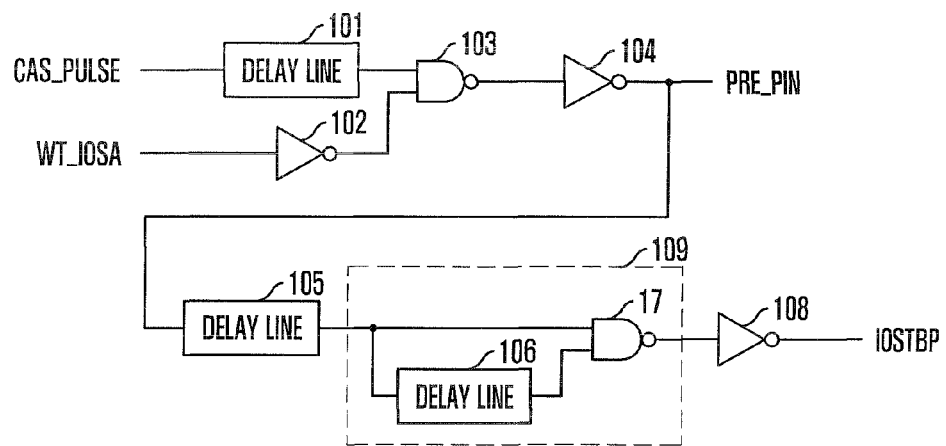
FIG. 1 is a block diagram illustrating a preliminary pin strobe signal generating unit of a conventional semiconductor memory device.
Figure 2:
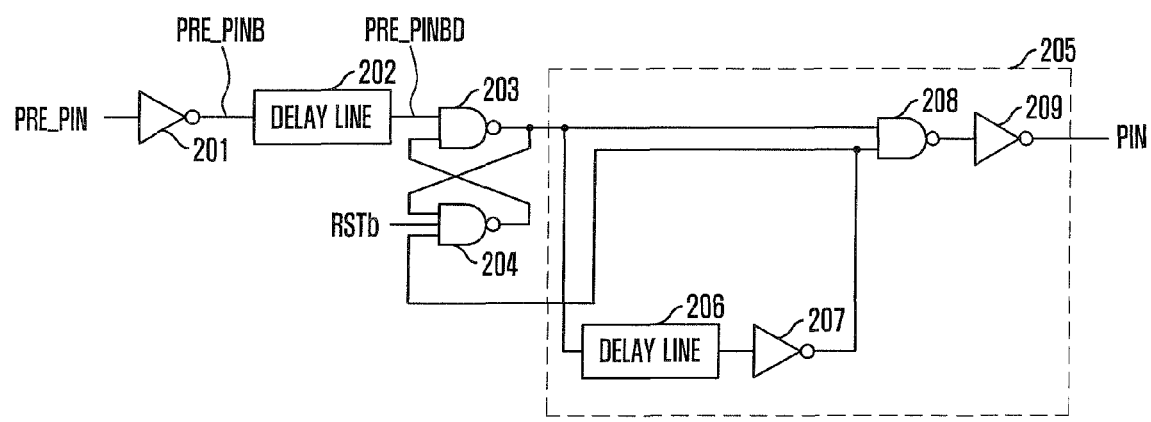
FIG. 2 is a block diagram illustrating a pin strobe signal generating unit.
Figure 3:
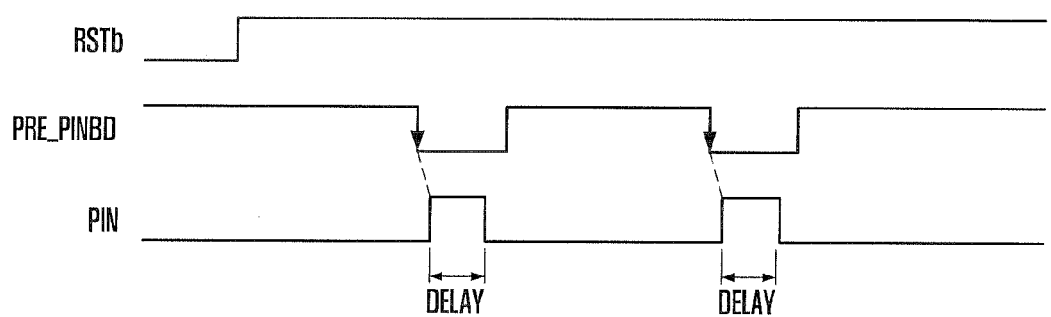
FIG. 3 is a timing diagram illustrating an operation of the pin strobe signal generating unit of FIG. 2.

Through a pin strobe signal transfer path indicated by an arrow in FIG. 5, the pin strobe signal is generated and transferred. Herein, the pin strobe signal transfer path also includes lines and logic gates through which the preliminary pin strobe signal PRE_PIN generated around a bank (e.g., generated in the circuit of FIG. 1) passes to the circuit of FIG. 5. Besides circuits shown in FIG. 5, the logic gates such as drivers or the like through which the pin strobe signal passes may be included. The arrow in FIG. 5 extending from the bank to the pipelatch denotes the pin strobe signal transfer path.

The delay controller 530 controls a delay value of the pin strobe signal transfer path in response to the latched detection signal VDD_MODE_D1. In detail, the delay controller 530 operates to increase the delay value when the latched detection signal VDD_MODE_D1 is activated because the VDD level is high. On the contrary, the delay controller 530 operates to decrease the delay value when the latched detection signal VDD_MODE_D1 is deactivated because the VDD level is low. The delay controller 530 may include two delay lines 531 and 532 and a delay selection unit 533. The delay lines 531 and 532 are configured to delay an inverted preliminary pin strobe bar signal PRE_PINBD by different delay times. The delay selection unit 533 is configured to select an output of one of the two delay lines 531 and 532 to transfer the selected output in response to the latched detection signal VDD_MODE_D1. The delay selection unit 533 selects an output of the delay line having a large delay value when the latched detection signal VDD_MODE_D1 is activated; however, the delay selection unit 533 selects an output of the delay line having a small delay value when the latched detection signal VDD_MODE_D1 is deactivated. For example, the delay selection unit 533 may include a typical multiplexer.

The delay controller 530 operates to increase a delay time of the preliminary pin strobe bar signal PRE_PINB when the power supply voltage VDD is high and to decrease the delay time when the power supply voltage VDD is low. Consequently, it is possible to prevent the activation timing of the pin strobe signal PIN from being advanced when the power supply voltage VDD is high, and also prevent the activation timing of the pin strobe signal PIN from being delayed when the power supply voltage VDD is low.

The embodiment of FIG. 5 exemplarily illustrates that the delay controller 530 is disposed in the front of the pulse width modulator 540 that modulates the pulse width of the pin strobe signal PIN. The delay controller 530, however, may be positioned anywhere on the pin strobe transfer path because the delay controller 530 function to control the activation timing of the pin strobe signal PIN depending on the power supply voltage VDD. For example, the delay controller 530 may be positioned in the rear of the pulse width modulator 540.

If, unlike FIG. 5, the voltage detector 510 generates a plurality of detection signals such as VDD_MODEA and VDD_MODEB (not shown), the delay controller 530 may be configured such that it includes delay lines having different delay values and an output of one of the delay lines is then selected. This allows the activation timing of the pin strobe signal PIN to be more finely controlled according as the power supply voltage VDD varies.

Figures 4A, 4B, 4C, 4D:
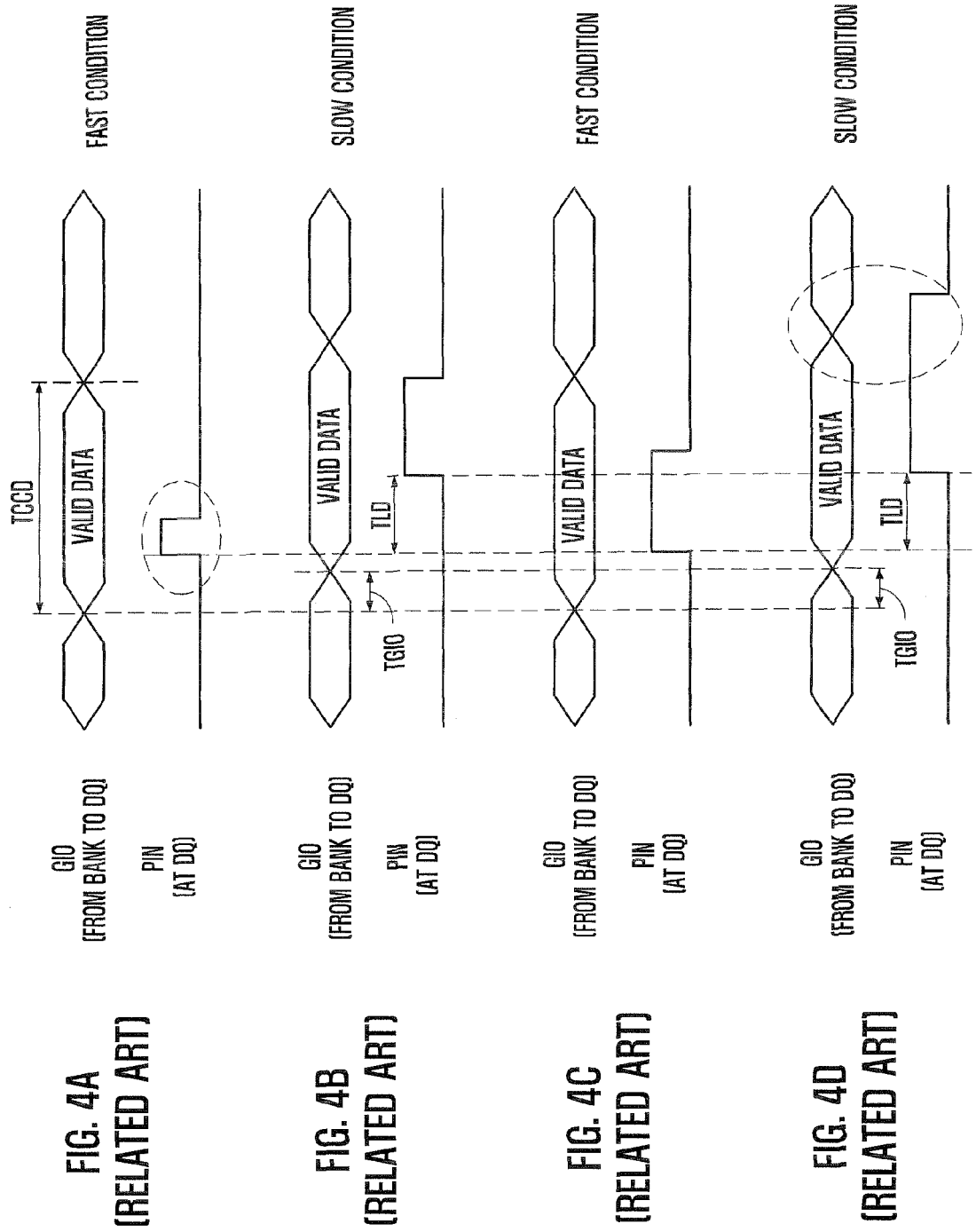
FIGS. 4A to 4D are timing diagrams of a pin strobe signal and data transferred through global input/output (GIO) lines during a read operation.

The pulse width modulator 540 is responsive to the latched detection signal VDD_MODE_D1 to modulate the pulse width of the pin strobe signal PIN on the pin strobe signal transfer path. The pulse width modulator 540 modulates the pulse width depending on whether the power supply voltage VDD is high or low, which differs from the conventional art. In detail, when the latched detection signal VDD_MODE_D1 is activated because the power supply voltage VDD is high, the pulse width modulator 540 operates to increase the pulse width. On the contrary, when the latched detection signal VDD_MODE_D1 is deactivated because the power supply voltage VDD is low, the pulse width modulator 540 operates to decrease the pulse width. Therefore, it is possible to solve a problem that the pulse width of the pin strobe signal PIN is narrowed when the power supply voltage VDD is high under FAST PVT condition of FIG. 4A. Also, it is possible to solve a problem that the pulse width of the pin strobe signal PIN is too broadened when the power supply voltage VDD is low under SLOW PVT condition of FIG. 4D.

The pulse width modulator 540 includes two delay lines 541 and 542, a multiplexing unit 543, a NAND gate 545 and inverters 544 and 546. The delay lines 541 and 542 have different delay values to determine the pulse width of the pin strobe signal PIN. The multiplexing unit 543 is configured to select one of the delay lines 541 and 542 in response to the latched detection signal VDD_MODE_D1. The pin strobe signal PIN has the pulse width corresponding to the delay value of the one of the delay lines 541 and 542 selected by the multiplexing unit 543.

The pulse width modulator 540 function to modulate the pulse width of the pin strobe signal PIN, and thus may be positioned anywhere on the pin strobe signal transfer path as well as a location shown in FIG. 5. Similarly to the delay controller 530, the pulse width modulator 540 may be designed to finely modulate the pulse width of the pin strobe signal PIN using a plurality of detection signals, for example, VDD_MODEA and VDD_MODEB (not shown) instead of VDD_MODE.

The semiconductor memory device of the invention includes the delay controller 530 configured to control the activation timing of the pin strobe signal PIN, and the pulse width modulator 540 configured to modulate the pulse width of the pin strobe signal PIN according to the power supply voltage (VDD) variation. Since the delay controller 530 and the pulse width modulator 540 serve different functions, the semiconductor memory device of the invention may include only the delay controller 530, or only the pulse width modulator 540, instead of both.

For example, in the case of improving only the activation timing of the pin strobe signal PIN, only the delay controller 530 need be used. In contrast, in the case of improving only the pulse width of the pin strobe signal PIN, only the pulse width controller 540 need be used.

While the semiconductor memory device of the invention preferably includes the delay controller 530 and the pulse width modulator 540, the semiconductor memory device of the invention operates the same as the conventional semiconductor memory device in other respects, and thus further description will be omitted herein.

Figure 6:
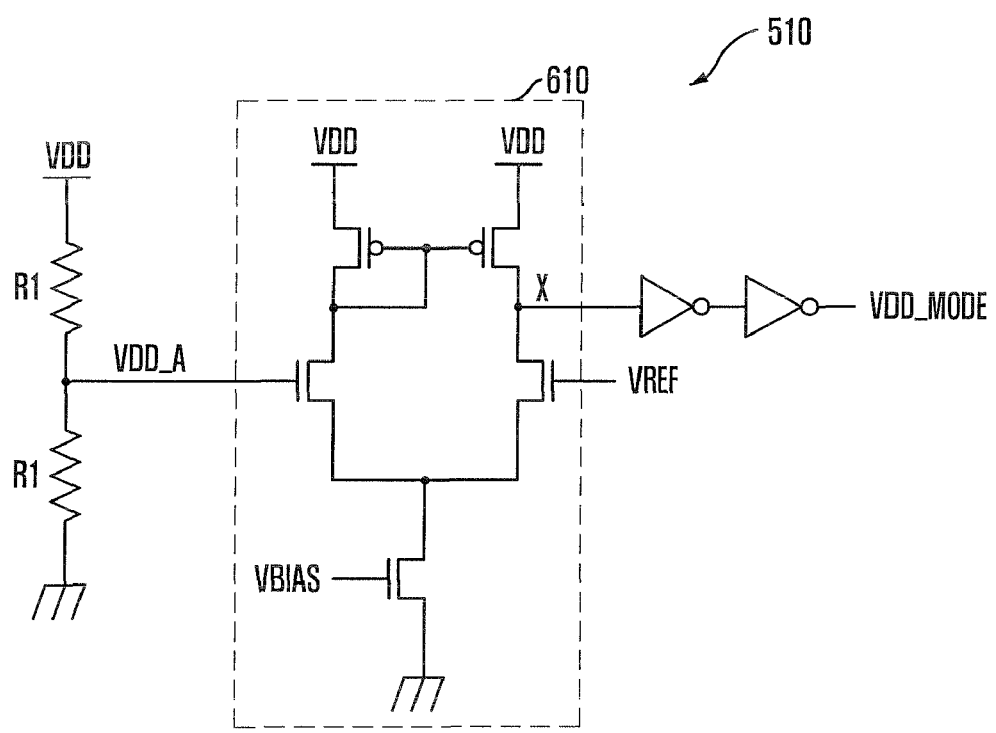
FIG. 6 is a schematic circuit diagram of a voltage detector in FIG. 5.

FIG. 6 is a schematic circuit diagram of the voltage detector 510 in FIG. 5.

The voltage detector 510 compares a level of a division voltage VDD_A obtained by dividing the power supply voltage VDD with a level of a reference voltage VREF, thereby generating the detection signal VDD_MODE. Here, the reference voltage VREF is a voltage that always has a constant level. As well known, the reference voltage VREF may be generated from a band-gap circuit in a memory device.

The power supply voltage VDD is divided by resistors R1 and R2 so that the division voltage VDD_A is generated. A differential amplifier 610 employing a bias voltage VBIAS compares the division voltage VDD_A with the reference voltage VREF. When the division voltage VDD_A is higher than the reference voltage VREF, a high-level signal is output through an output terminal X of the differential amplifier 610 so that the detection signal VDD_MODE is activated to a logic high level. However, when the division voltage VDD_A is lower than the reference voltage VREF, a low-level signal is output through the output terminal X of the differential amplifier 610 so that the detection signal VDD_MODE is deactivated to a logic low level.

A resistance ratio between the resistors R1 and R2 and a level of the reference voltage VREF may be suitably set in consideration of the activation timing of the detection signal VDD_MODE according to the VDD level. For example, in the case of activating the detection signal VDD_MODE when the power supply voltage VDD is 1.6 V or more, the voltage detector 510 may be designed such that the resistors R1 and R2 have the same resistance and the reference voltage VREF is 0.8 V.

In accordance with the invention, a pulse width of a pin strobe signal is increased when delay values of logic circuits decrease because a power supply voltage is high; however, the pulse width of the pin strobe signal is decreased when delay values of the logic circuits increase because the power supply voltage is low. Therefore, it is possible to solve a problem that data cannot be loaded on a pipelatch properly because the pulse width of the pin strobe signal is too narrow under FAST PVT condition of FIG. 4A (under condition of a high power supply voltage). Further, it is possible to solve a problem that the activation period of the pin strobe signal falls out of the period for valid data because the pulse width of the pin strobe signal is too broad under SLOW PVT condition of FIG. 4D (under condition of a low power supply voltage).

In addition, when the power supply voltage is high, the delay time of the pin strobe signal is increased so that its activation timing is delayed. In contrast, when the power supply voltage is low, the delay time of the pin strobe signal is decreased so that its activation timing is advanced. Consequently, it is possible to prevent the activation timing of the pin strobe signal from being delayed or advanced due to a power supply voltage variation, thus improving a timing margin of the pin strobe signal.

While the invention has been described with respect to the specific embodiments, it will be apparent to those skilled in the art that various changes and modifications may be made without departing from the spirit and scope of the invention as defined in the following claims.

In particular, as described above, the delay controller 530 and the pulse width modulator 540 may be positioned at locations shown in the drawings but also positioned anywhere on the pin strobe signal transfer path as well.

What is claimed is:

1. A semiconductor memory device, comprising:
   a voltage detector configured to detect a level of a power supply voltage to output a detection signal;
   a pin strobe signal transfer path configured to transfer a pin strobe signal determining an input timing of data to a pipelatch; and
   a delay controller configured to change an activation timing of the pin strobe signal by changing an amount of a delay through the delay controller in response to the detection signal.

2. The semiconductor memory device as recited in claim 1, wherein the voltage detector compares a level of a divided voltage obtained by dividing the power supply voltage with a reference voltage level to generate the detection signal.

3. The semiconductor memory device as recited in claim 1, wherein the pin strobe signal transfer path transfers the pin strobe signal from a bank to the pipelatch.

4. The semiconductor memory device as recited in claim 1, wherein the delay controller includes:
   delay lines configured to delay the pin strobe signal for different delay times, respectively, and
   a delay selection unit configured to select an output of one of the delay lines and transfer the selected output in response to the detection signal.

5. The semiconductor memory device as recited in claim 1, further comprising a level maintainer configured to maintain the detection signal at a constant level during a read operation.

6. A semiconductor memory device, comprising:
   a voltage detector configured to detect a level of a power supply voltage to output a detection signal;
   a pin strobe signal transfer path configured to transfer a pin strobe signal determining an input timing of data to a pipelatch; and
   a pulse width modulator configured to modulate a pulse width of the pin strobe signal by changing a pulse width of an output signal of the pulse width modulator in response to the detection signal.

7. The semiconductor memory device as recited in claim 6, wherein the voltage detector compares a level of a divided voltage obtained by dividing the power supply voltage with a reference voltage level to generate the detection signal.

8. The semiconductor memory device as recited in claim 6, wherein the pulse width modulator includes delay lines configured to have different delay times, respectively, and selects one of the delay lines to determine the pulse width of the pin strobe signal in response to the detection signal.

9. The semiconductor memory device as recited in claim 6, wherein the pulse width modulator increases a pulse width of the pin strobe signal when the power supply voltage is higher than a predetermined voltage.

10. The semiconductor memory device as recited in claim 6, wherein the pin strobe signal transfer path transfers the pin strobe signal from a bank to the pipelatch.

11. The semiconductor memory device as recited in claim 6, further comprising a level maintainer configured to maintain the detection signal at a constant level during a read operation.

12. A semiconductor memory device, comprising:
   a voltage detector configured to detect a level of a power supply voltage to output a detection signal;
   a pin strobe signal transfer path configured to transfer a pin strobe signal determining an input timing of data to a pipelatch;
   a delay controller configured to chance an activation timing of the pin strobe signal by changing an amount of a delay through the delay controller in response to the detection signal; and
   a pulse width modulator configured to modulate a pulse width of the pin strobe signal by changing a pulse width of an output signal of the pulse width modulator in response to the detection signal.

13. The semiconductor memory device as recited in claim 12, wherein the voltage detector compares a level of a divided voltage obtained by dividing the power supply voltage with a reference voltage level to generate the detection signal.

14. The semiconductor memory device as recited in claim 12, wherein the pin strobe signal transfer path transfers the pin strobe signal from a bank to the pipelatch.

15. The semiconductor memory device as recited in claim 12, wherein the delay controller includes:
   delay lines configured to delay the pin strobe signal by different delay times, respectively, and
   a delay selection unit configured to select an output of one of the delay lines and transfer the selected output in response to the detection signal.

16. The semiconductor memory device as recited in claim 12, wherein the pulse width modulator includes delay lines configured to have different delay times, respectively, and selects one of the delay lines to determine the pulse width of the pin strobe signal in response to the detection signal.

17. The semiconductor memory device as recited in claim 12, wherein the delay controller increases the delay value of the pin strobe signal transfer path and the pulse width modulator increases the pulse width of the pin strobe signal when the power supply voltage is higher than the predetermined voltage.

18. The semiconductor memory device as recited in claim 12, further comprising a level maintainer configured to maintain the detection signal at a constant level during a read operation.

* * * * *